United States Patent
Tanaka

(10) Patent No.: US 10,035,697 B2
(45) Date of Patent: Jul. 31, 2018

(54) PHYSICAL QUANTITY SENSOR, MANUFACTURING METHOD OF PHYSICAL QUANTITY SENSOR, SENSOR DEVICE, ELECTRONIC APPARATUS, AND MOVING OBJECT

(71) Applicant: Seiko Epson Corporation, Tokyo (JP)

(72) Inventor: Satoru Tanaka, Chino (JP)

(73) Assignee: Seiko Epson Corporation (JP)

(*) Notice: Subject to any disclaimer, the term of this patent is extended or adjusted under 35 U.S.C. 154(b) by 0 days.

(21) Appl. No.: 15/275,831

(22) Filed: Sep. 26, 2016

(65) Prior Publication Data

US 2017/0088413 A1    Mar. 30, 2017

(30) Foreign Application Priority Data

Sep. 29, 2015   (JP) .................................. 2015-191434

(51) Int. Cl.
*B81B 3/00*         (2006.01)
*B81C 1/00*         (2006.01)

(52) U.S. Cl.
CPC ........ *B81B 3/0072* (2013.01); *B81C 1/00666* (2013.01); *B81B 2203/0181* (2013.01); *B81C 2203/031* (2013.01)

(58) Field of Classification Search
CPC ..... B81B 2203/0181; B81B 2203/0118; B81B 3/0072

See application file for complete search history.

(56) References Cited

U.S. PATENT DOCUMENTS

| | | |
|---|---|---|
| 6,065,341 A | 5/2000 | Ishio et al. |
| 9,244,092 B2 | 1/2016 | Yoda |
| 2014/0183014 A1* | 7/2014 | Inoue ................. H01H 59/0009 200/181 |
| 2014/0338451 A1 | 11/2014 | Takagi |
| 2014/0353774 A1 | 12/2014 | Zhang et al. |

FOREIGN PATENT DOCUMENTS

| | | |
|---|---|---|
| CN | 104166013 A | 11/2014 |
| JP | 11-230986 A | 8/1999 |
| JP | 2012-220262 A | 11/2012 |
| JP | 2013-156121 A | 8/2013 |

* cited by examiner

*Primary Examiner* — Asok K Sarkar
*Assistant Examiner* — Grant Withers
(74) *Attorney, Agent, or Firm* — Harness, Dickey & Pierce, P.L.C.

(57) ABSTRACT

A physical quantity sensor includes a base substrate; a movable unit which is provided so as to be displaced with respect to the base substrate by facing the base substrate; a first fixed electrode and a second fixed electrode which are disposed on the base substrate by facing the movable unit; and a plurality of protrusion portions which are disposed at a position overlapped with the movable unit in a planar view, on the movable unit side of the base substrate, in which the protrusion portion includes a conductive layer with the same potential as that of the first fixed electrode and the second fixed electrode, and an insulating layer which is provided on a side opposite to the base substrate with respect to the conductive layer.

18 Claims, 12 Drawing Sheets

PHYSICAL QUANTITY SENSOR, MANUFACTURING METHOD OF PHYSICAL QUANTITY SENSOR, SENSOR DEVICE, ELECTRONIC APPARATUS, AND MOVING OBJECT

BACKGROUND

1. Technical Field

The present invention relates to a physical quantity sensor, a manufacturing method of the physical quantity sensor, a sensor device, an electronic apparatus, and a moving object.

2. Related Art

As a physical quantity sensor which detects a physical quantity such as acceleration and an angular velocity, a sensor with a configuration in which a movable body which can be displaced by facing a substrate is provided has been known (for example, refer to JPA-2013-156121). For example, a physical quantity sensor which is described in JP-A-2013-156121 includes a substrate, an oscillating body which is provided above the substrate, a supporting portion which supports the oscillating body so as to oscillate, and a detecting electrode which is provided on the substrate, and is disposed so as to face the oscillating body. In such a physical quantity sensor, acceleration is detected based on capacitor between the oscillating body and the detecting electrode.

In addition, a protrusion portion is provided on a side face on both ends of the oscillating body in a direction which intersects a center axis of oscillation, in the physical quantity sensor which is described in JP-A-2013-156121. Due to this, it is possible to suppress an excessive displacement of the oscillating body.

In the above described physical quantity sensor which is described in JP-A-2013-156121, there was a problem in that bonding of an oscillating body and a substrate easily occurred, since a protrusion portion is in contact with a portion of the substrate which is exposed from the detecting electrode. In addition, there was a problem in that the protrusion portion was easily damaged when being in contact with the substrate, since the protrusion portion is configured integrally with the oscillating body.

SUMMARY

An advantage of some aspects of the invention is to provide a physical quantity sensor which can preferably prevent or alleviate bonding of a movable body and a substrate, a manufacturing method thereof, and a sensor device, an electronic apparatus, and a moving object which are provided with the physical quantity sensor.

The advantage can be obtained using the following aspect of the invention.

According to an aspect of the invention, there is provided a physical quantity sensor which includes a substrate; a movable body which is provided so as to be displaced with respect to the substrate by facing the substrate; an electrode which is disposed on the substrate by facing the movable body; and a protrusion portion which is disposed at a position overlapped with the movable body in a planar view, on the movable body side of the substrate, in which the protrusion portion includes a conductive layer with the same potential as that of the electrode, and an insulating layer which is provided on a side opposite to the substrate with respect to the conductive layer.

According to the physical quantity sensor, since the protrusion portion is disposed at a position which is overlapped with the movable body, in a planar view, on the movable body side of the substrate, it is possible to prevent or alleviate bonding to the substrate of the movable body using the protrusion portion. Here, since the protrusion portion is provided on the substrate side and not the movable body side, it is possible to reduce damage of the protrusion portion by increasing toughness of the protrusion portion. In addition, since a conductive layer of the protrusion portion has the same potential as that of the electrode, it is possible to prevent or alleviate bonding to the substrate of the movable body, by electrically connecting the movable body and the electrode, when performing anodic bonding of the substrate and another substrate, for example, at the time of manufacturing the physical quantity sensor.

It is possible to prevent a short circuit between the movable body and the electrode, when the movable body is in contact with the protrusion portion, since the insulating layer of the protrusion portion is provided at a tip end side of the protrusion portion with respect to the conductive layer.

In addition, it is also possible to prevent or reduce damage, or the like, of the movable body by regulating an excessive displacement of the movable body using the protrusion portion.

In the physical quantity sensor according to the aspect of the invention, it is preferable that the protrusion portion is disposed at a position which is overlapped with the electrode in the planar view, and the conductive layer is configured integrally with the electrode.

In this manner, it is possible to collectively form the conductive layer of the protrusion portion and the electrode. For this reason, it is possible to make a manufacturing process of the physical quantity sensor which is accompanied by forming of the protrusion portion simple.

In the physical quantity sensor according to the aspect of the invention, it is preferable that the protrusion portion has a protrusion which is configured integrally with the substrate on the substrate side, with respect to the conductive layer.

Due to this, it is possible to easily make the protrusion portion high.

In the physical quantity sensor according to the aspect of the invention, it is preferable that the insulating layer is a silicon oxide film.

Due to this, it is possible to form an insulating layer with an excellent insulating property simply with high accuracy, using a film forming method.

In the physical quantity sensor according to the aspect of the invention, it is preferable that the movable body is provided so as to oscillate around a center axis of oscillation, and is divided into a first movable unit and a second movable unit by setting the center axis of oscillation to a boundary, in a planar view which is viewed from a thickness direction of the substrate, and the electrode includes a first electrode which is disposed on the substrate by facing the first movable unit, and a second electrode which is disposed on the substrate by facing the second movable unit.

Due to this, it is possible to obtain an acceleration sensor of a so-called seesaw-type capacitance system.

In the physical quantity sensor according to the aspect of the invention, it is preferable that an area of the second movable unit is larger than that of the first movable unit in the planar view.

Due to this, it is possible to easily make moments around the center axis of oscillation of the first movable unit and the second movable unit different. In addition, in the movable body which includes the first movable unit and the second movable unit, the second movable unit is easily in contact with the substrate. For this reason, in such a case, it is possible to make an effect thereof remarkable by applying the invention.

According to another aspect of the invention, there is provided a manufacturing method of a physical quantity sensor which includes forming a movable body which can be displaced with respect to a first substrate by facing the first substrate, and an electrode which faces the movable body on the first substrate, and forming a protrusion portion which is overlapped with the movable body, in a planar view, on the movable body side of the first substrate; electrically connecting the movable body and the electrode; bonding a second substrate which forms a space for accommodating the movable body along with the first substrate to the first substrate, in a state in which the movable body and the electrode are electrically connected; and releasing the electrical connection between the movable body and the electrode, in which the protrusion portion includes a conductive layer with the same potential as that of the electrode, and an insulating layer which is provided on a side opposite to the first substrate with respect to the conductive layer.

According to the manufacturing method of the physical quantity sensor, it is possible to prevent or alleviate bonding to the first substrate of the movable body, even in a case in which the first substrate and the second substrate are subjected to anodic bonding.

According to still another aspect of the invention, there is provided a sensor device which includes the physical quantity sensor according to the aspect of the invention, and an electronic component which is electrically connected to the physical quantity sensor.

According to the sensor device, it is possible to increase reliability, by preventing or relieving bonding to a substrate of a movable body.

According to still another aspect, there is provided an electronic apparatus which includes the physical quantity sensor according to the aspect of the invention.

According to the electronic apparatus, it is possible to increase reliability, by preventing or relieving bonding to a substrate of a movable body.

According to still further another aspect, there is provided a moving object which includes the physical quantity sensor according to the aspect of the invention.

According to the moving object, it is possible to increase reliability, by preventing or relieving bonding to a substrate of a movable body.

BRIEF DESCRIPTION OF THE DRAWINGS

The invention will be described with reference to the accompanying drawings, wherein like numbers reference like elements.

DESCRIPTION OF EXEMPLARY EMBODIMENTS

Hereinafter a physical quantity sensor, a manufacturing method of the physical quantity sensor, a sensor device, an electronic apparatus, and a moving object of the invention will be described in detail, based on embodiments which are illustrated in accompanying drawings.

1. Physical Quantity Sensor

First Embodiment

Figure 1:
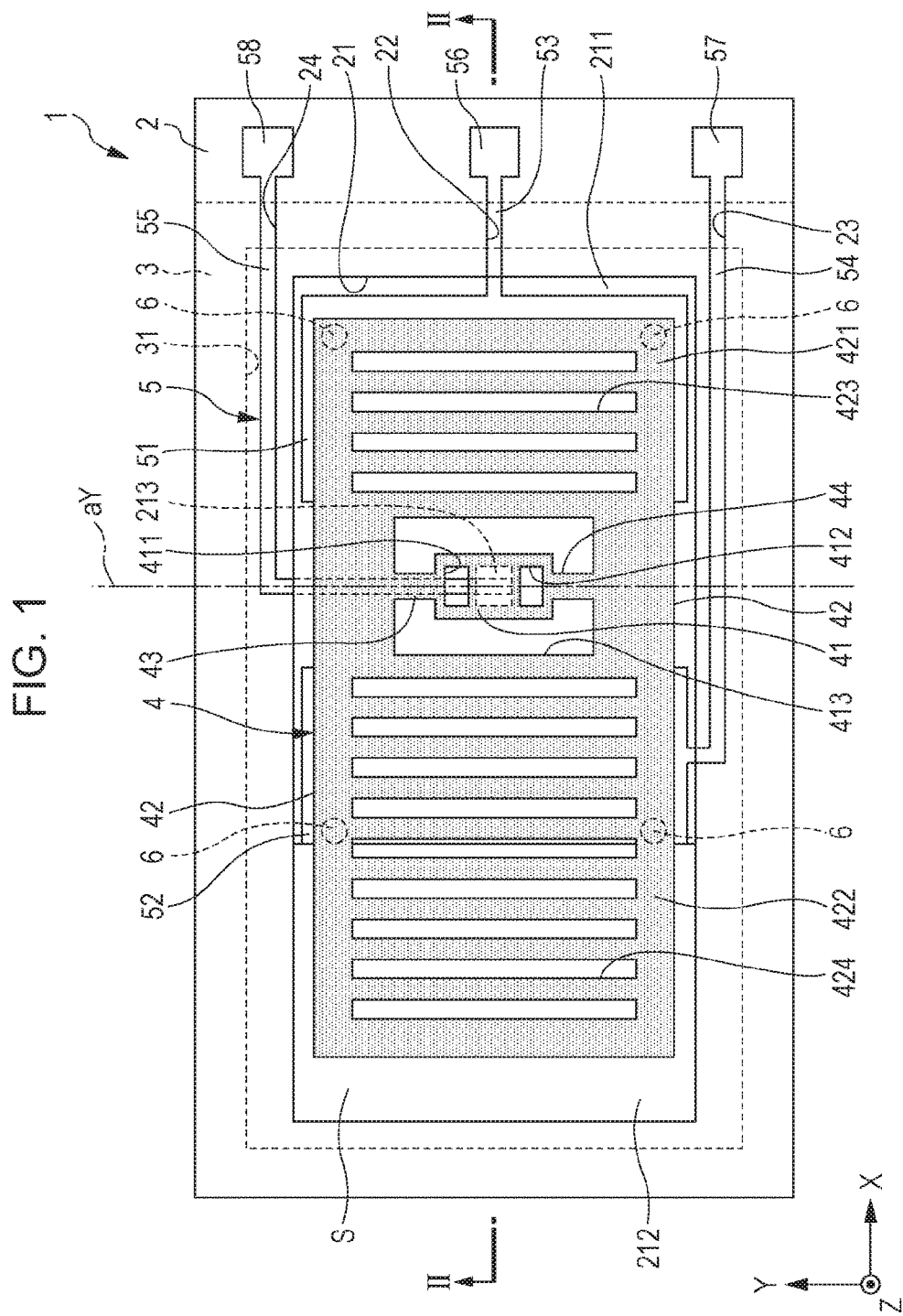
FIG. 1 is a plan view (top view) which illustrates a physical quantity sensor according to a first embodiment of the invention.
Figure 2:
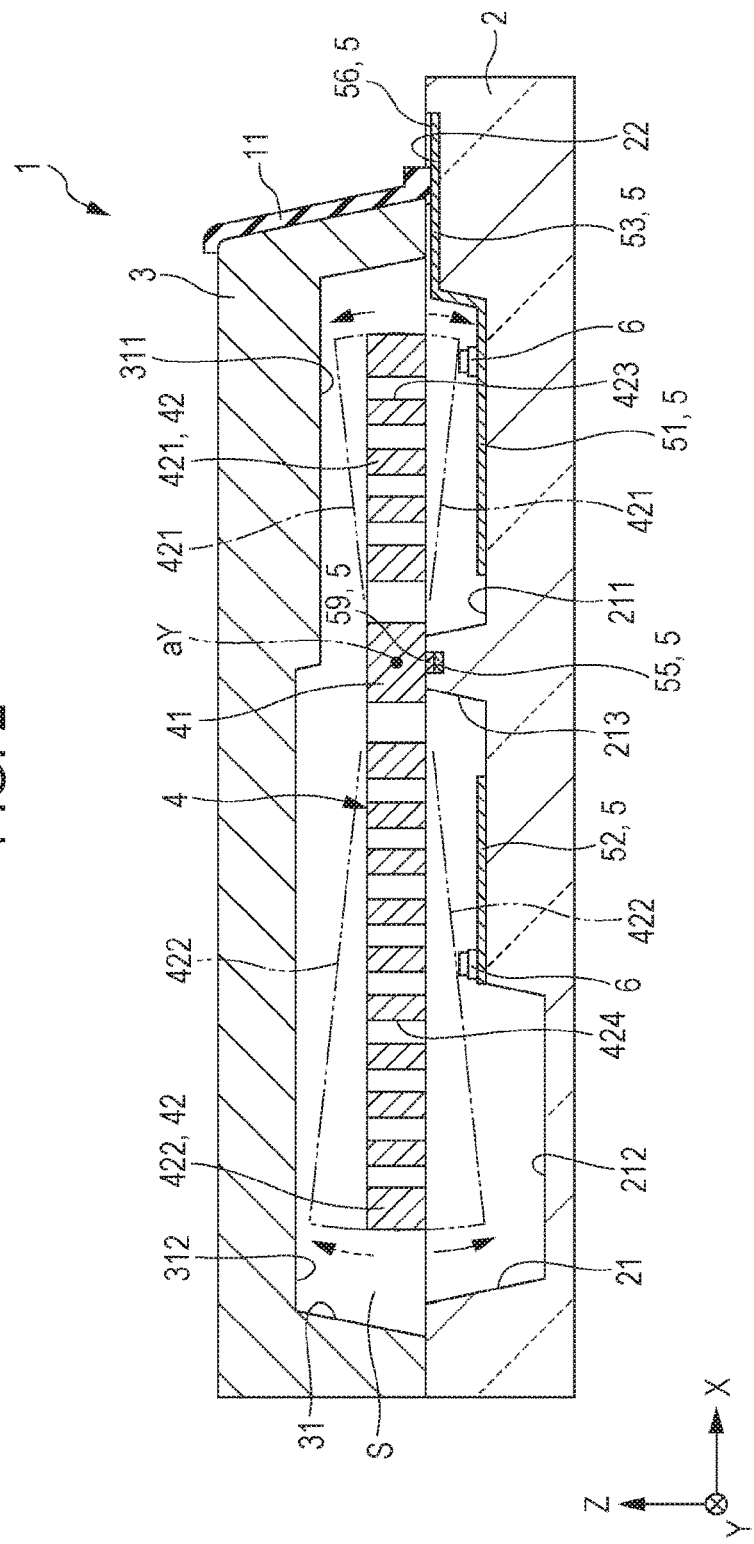
FIG. 2 is a sectional view which is taken along line II-II in FIG. 1.

FIG. 1 is a plan view (top view) which illustrates a physical quantity sensor according to a first embodiment of the invention. FIG. 2 is a sectional view which is taken along line II-II in FIG. 1. In each figure, for ease of descriptions, an X axis, a Y axis, and a Z axis are illustrated as three axes which are orthogonal to each other, and a tip end side of an arrow which denotes each axis is denoted by "+", and a base end side is denoted by "−". In addition, hereinafter, a direction parallel to the X axis will be referred to as an "X axis direction", a direction parallel to the Y axis will be referred to as a "Y axis direction", and a direction parallel to the Z axis will be referred to as a "Z axis direction". In addition, the +Z axis direction side is also referred to as an "upper side", and the −Z axis direction side is also referred to as a "lower side".

A physical quantity sensor 1 illustrated in FIGS. 1 and 2 is used as an inertial sensor, for example, and is used, specifically, as an acceleration sensor for measuring acceleration in the Z axis direction. The physical quantity sensor 1 includes a base substrate 2 (first substrate), a lid 3 (second substrate), an oscillating structure body 4 (movable electrode) which is disposed in an inner space S which is formed by the base substrate and the lid, a conductive pattern 5 which is disposed on the base substrate 2, and a plurality of protrusion portions 6 which have a function of preventing bonding of the base substrate 2 and the oscillating structure body 4. Hereinafter, each unit of the physical quantity sensor 1 will be described in order.

Base Substrate

The base substrate 2 is formed in a plate shape, and a recessed portion 21 is formed on a top face of the base substrate 2. The recessed portion 21 functions as an escaping portion which prevents a movable unit 42, and connecting portions 43 and 44 of the oscillating structure body 4, which will be described later, from being in contact with the base substrate 2. A bottom face of the recessed portion 21 includes two portions 211 and 212 with different depths, though it will be described in detail later. In addition, a protrusion 213 which is protruded is provided at a center portion of the bottom face (portion 211) of the recessed portion 21. A supporting portion 41 of the oscillating structure body 4, which will be described later, is fixed to the protrusion 213. In addition, a side face of the recessed portion 21, and a side face of the protrusion 213 are inclined. Due to this, it is possible to easily perform routing of wiring from the bottom face of the recessed portion 21 to a top face of the base substrate 2, and reduce a failure in forming wiring, disconnection, or the like. In addition, recessed portions 22, 23, and 24 which are disposed at the periphery of the recessed portion 21 are formed on the base substrate 2. A part of wiring 53, 54, and 55 of the conductive pattern 5, which will be described later, and terminals 56, 57, and 58 are disposed in these recessed portions 22, 23, and 24.

It is preferable that the base substrate 2 has an insulating property, and for example, the base substrate is formed of a glass material. In particular, when the base substrate 2 is formed of a glass material containing an alkali metal ion such as borosilicate glass, in a case in which the lid 3 or the oscillating structure body 4 is formed, using silicon, it is possible to perform bonding of the lid, the oscillating structure body, and the base substrate 2 using anodic bonding. A constituent material of the base substrate 2 is not limited to a glass material, and for example, a high resistive silicon material may be used. In addition, an insulating layer such as a silicon oxide film or a silicon nitride film may be formed on the surface of the base substrate 2, as necessary.

Conductive Pattern

The conductive pattern 5 is provided on the top face of the base substrate 2. The conductive pattern 5 includes a first fixed electrode 51 (first electrode), and a second fixed electrode 52 (second electrode) which are disposed on the bottom face of the recessed portion 21 as electrodes. In addition, the conductive pattern 5 includes wiring 53 which is connected to the first fixed electrode 51 in the recessed portion 21, and is routed inside the recessed portion 22, wiring 54 which is connected to the second fixed electrode 52 in the recessed portion 21, and is routed inside the recessed portion 23, and wiring 55 which is connected to the oscillating structure body 4 in the protrusion 213, and is routed inside the recessed portion 24, as wiring. Here, the wiring 55 is connected to the oscillating structure body 4 through a conductive bump 59 in the inside of a groove which is formed on a top face of the protrusion 213. In addition, the conductive pattern 5 includes a terminal 56 which is disposed inside the recessed portion 22, and is connected to the wiring 53, a terminal 57 which is disposed inside the recessed portion 23, and is connected to the wiring 54, and a terminal 58 which is disposed inside the recessed portion 24, and is connected to the wiring 55, as terminals. Here, the terminals 56, 57, and 58 are disposed in the outer side of the inner space S. In this manner, it is possible for the conductive pattern 5 and the outside (for example, IC chip 102 which will be described later) to be in contact.

A constituent material of the conductive pattern 5 is not limited, particularly, when it is a material with conductivity, and for example, there is an oxide (transparent electrode material) such as ITO (Indium Tin Oxide), IZO (Indium Zinc Oxide), $In_2O_3$, $SnO_2$, $SnO_2$ containing Sb, and ZnO containing Al, or the like, and Au, Pt, Ag, Cu, and Al, or an alloy, or the like, including thereof, and it is possible to combine one type, or two or more types thereof, and use thereof.

Oscillating Structure Body

As illustrated in FIGS. 1 and 2, the oscillating structure body 4 is provided above the base substrate 2. The oscillating structure body 4 includes the supporting portion 41, a plate-shaped movable unit 42 (movable body) which is disposed by facing the base substrate 2, and a pair of connecting portions 43 and 44 which connects the movable unit 42 and the supporting portion 41 so that the movable unit 42 can oscillate with respect to the supporting portion 41. In addition, the oscillating structure body is configured so that the movable unit 42 can perform seesaw oscillating with respect to the supporting portion 41 by having an axis aY which goes along the connecting portions 43 and 44 as a center axis of oscillation.

The movable unit 42 is formed in a longitudinal shape (approximately rectangular shape) which extends in the X axis direction. The movable unit 42 is divided into a first movable unit 421 which is located on the −X direction side (one side), and a second movable unit 422 which is located on the +X axis direction (the other side) by having the axis aY as the center axis of oscillation as a boundary, in a planar view which is viewed from a thickness direction of the base substrate 2 or the movable unit 42 (hereinafter, simply referred to as "planar view").

Here, the first movable unit 421 is overlapped with a first fixed electrode 51, and meanwhile, the second movable unit 422 is overlapped with a second fixed electrode 52 when viewed planarly. That is, the first fixed electrode 51 is disposed on the base substrate 2 by facing the first movable unit 421, and forms a capacitance Ca between the first fixed electrode and the first movable unit 421. In addition, the second fixed electrode 52 is disposed on the base substrate 2 by facing the second movable unit 422, and forms a capacitance Cb between the second fixed electrode and the second movable unit 422.

In addition, a plurality of slits 423 which extend in the Y axis direction are formed in the first movable unit 421 by aligning in the X axis direction, and similarly, a plurality of slits 424 are formed in the second movable unit 422. In this manner, it is possible to reduce gas dumping among the movable unit 42, base substrate 2, and the lid 3. An opening 413 is formed between the first movable unit 421 and the second movable unit 422 of the movable unit 42. The supporting portion 41, and the connecting portions 43 and 44 are disposed inside the opening 413.

In the first movable unit 421 and the second movable unit 422, angular moments (inertial moment) around the axis aY, when acceleration in the Z axis direction is applied, are different from each other. Due to this, when acceleration in the Z axis direction is received, the movable unit 42 performs seesaw oscillating around the axis aY, and a predetermined inclination occurs in the movable unit 42 according to the x acceleration which is added. According to the embodiment, though the thickness of the first movable unit 421 and the second movable unit 422 in the Z axis direction, and the width in the Y axis direction are the same as each other, the length of the second movable unit 422 in the X axis direction is set to be larger than that of the first movable unit 421 in the X axis direction. Due to this, an angular moment of the second movable unit 422 is set to be larger than that of the first movable unit 421. By adopting such a design, it is possible to make angular moments of the first movable unit 421 and the second movable unit 422 different from each other, relatively simply.

As described above, the width of the first movable unit 421 and the second movable unit 422 in the Y axis direction are the same as each other; however, since the length of the second movable unit 422 in the X axis direction is larger than that of the first movable unit 421 in the X axis direction, an area of the second movable unit 422 becomes larger than that of the first movable unit 421, when viewed planarly.

The shapes of the first movable unit 421 and the second movable unit 422 are not limited to the above described shapes, when angular moments around the axis aY are different from each other, as described above, and shapes in a planar view may be the same (shape symmetric with respect to axis aY), when the thickness of the first movable unit 421 and the second movable unit 422 are different from each other, for example. In addition, even when the shapes of the first movable unit 421 and the second movable unit 422 are the same, it is possible to set angular moments around the axis aY of the first movable unit 421 and the second movable unit 422 to be different from each other, by disposing a weight in any one of the first movable unit 421 and the second movable unit 422. The weight may be disposed as a separate body using a weight material such as tungsten, or molybdenum, for example, or may be formed integrally with the movable unit 42.

As described above, a center portion in the Y axis direction of the supporting portion 41 which is disposed inside the opening portion 413 is bonded to the protrusion 213 of the base substrate 2. In addition, the supporting portion 41 and the movable unit 42 are connected by the connecting portions 43 and 44 which are disposed inside the opening portion 413 along with the supporting portion 41. In addition, the connecting portions 43 and 44 are coaxially provided on both sides of the supporting portion 41. In addition, the connecting portions 43 and 44 function as a torsion spring, when the movable unit 42 performs seesaw oscillating around the axis aY.

The portions on both sides of the supporting portion 41 in the Y axis direction are separated with respect to the base substrate 2, and through holes 411 and 412 are formed in the portions. The through holes 411 and 412 are disposed on the axis aY. Due to this, for example, it is possible to alleviate an influence of stress on the connecting portions 43 and 44, which is caused by a difference in coefficient of linear expansion between the base substrate 2 and the oscillating structure body 4. In addition, the shape of the supporting portion 41 is not limited to the above described shape, and for example, the through holes 411 and 412 may be omitted.

The oscillating structure body 4 is formed of silicon in which impurities such as phosphorus or boron, for example, is doped. In this manner, it is possible to obtain the oscillating structure body 4 of which a size is excellently accurate, by machining a silicon substrate using etching. In addition, in a case in which the base substrate 2 is formed of a glass material, it is possible to bond the oscillating structure body 4 and the base substrate 2 using anodic bonding. A constituent material of the oscillating structure body 4 is not limited to silicon. In addition, a base material itself of the oscillating structure body 4 may not be conductive, and in this case, a conductive layer of metal, or the like, may be formed on the surface of the movable unit 42, for example.

Lid

The lid 3 is disposed on a side opposite to the base substrate 2 with respect to the movable unit 42 of the oscillating structure body 4 which is described above. In addition, the lid 3 is bonded to the base substrate 2. The lid 3 is formed in a plate shape, and a recessed portion 31 is formed on a lower face (face on base substrate 2 side) of the lid 3. The recessed portion 31 forms the inner space S along with the above described recessed portion 21 of the base substrate 2. In addition, a bottom face of the recessed portion 31 has two portions of 311 and 312 of which depth are different.

The lid 3 is formed of silicon, for example. Due to this, in a case in which the base substrate 2 is formed of a glass material, it is possible to bond the lid 3 and the base substrate 2 using anodic bonding. As described above, since the recessed portions 22, 23, and 24 which lie across the inside and outside of the inner space S are formed on a top face of the base substrate 2, the inside and outside of the inner space S communicate through the recessed portions 22, 23, and 24 in a state in which the lid is merely bonded to the base substrate 2. Therefore, according to the embodiment, as illustrated in FIG. 2, the recessed portions 22, 23, and 24 are blocked, using a sealing portion 11 such as an $SiO_2$ film which is formed by using a TEOS CVD method, or the like, and the inner space S is hermetically sealed.

Hitherto, the configuration of the physical quantity sensor 1 has been simply described. In the physical quantity sensor 1 with such a configuration, acceleration in the Z axis direction is detected as follows.

When acceleration in the Z axis direction is added to the physical quantity sensor 1, the movable unit 42 performs seesaw oscillating by having the axis aY as the center axis of oscillation, since angular moments around the axis aY of the first movable unit 421 and the second movable unit 422 are different from each other. At this time, since an angular moment of the second movable unit 422 is larger than that of the first movable unit 421, the movable unit 42 performs seesaw oscillating around the axis aY so that the first movable unit 421 goes far from the first fixed electrode 51, and the second movable unit 422 gets closer to the second fixed electrode 52 in a case in which a direction of acceleration which is added to the physical quantity sensor 1 is the −Z axis direction. Meanwhile, in a case in which a direction of acceleration which is added to the physical quantity sensor 1 is the +Z axis direction, the movable unit 42 performs seesaw oscillating around the axis aY so that the first movable unit 421 gets closer to the first fixed electrode 51, and the second movable unit 422 goes far from the second fixed electrode 52.

In this manner, clearance between the first movable unit 421 and the first fixed electrode 51, and clearance between the second movable unit 422 and the second fixed electrode 52 are changed, respectively, according to a direction or a magnitude of acceleration which is added to the physical quantity sensor 1, and the capacitances Ca and Cb are changed accompanied by this. For this reason, it is possible to detect a value of acceleration based on an amount of change in the capacitances Ca and Cb (for example, differential signals of capacitances Ca and Cb).

In this manner, it is possible to obtain an acceleration sensor of so-called seesaw-type electrostatic capacitance system in the physical quantity sensor 1. Protrusion portion The physical quantity sensor 1 includes a plurality of protrusion portions 6 which can prevent or alleviate bonding to the base substrate 2 of the movable unit 42. Here, since an area of the second movable unit 422 is larger than that of the first movable unit 421, when viewed planarly, the second movable unit 422 is easily in contact with the base substrate 2.

As illustrated in FIG. 1, the plurality of (four in the embodiment) protrusion portions 6 are disposed at a position which is overlapped with the movable unit 42, when viewed planarly, on the movable unit 42 side of the base substrate 2. Due to this, it is possible to prevent or alleviate bonding to the base substrate 2 of the movable unit 42 using the protrusion portion 6. Here, it is possible to reduce a damage of the protrusion portion 6 by increasing toughness of the protrusion portion 6, since the protrusion portion 6 is provided on the base substrate 2 side, not the movable unit 42 side. In addition, it is possible to prevent or reduce damage, or the like, of the oscillating structure body 4 as a structure body including the movable unit 42, by regulating an excessive displacement of the movable unit 42 using the protrusion portion 6.

The plurality of protrusion portions 6 are disposed by being overlapped with an end portion of the movable unit 42 in the Y axis direction. In addition, the plurality of protrusion portions 6 are disposed so as to be symmetric with respect to the axis aY when viewed planarly. Here, two protrusion portions 6 among four protrusion portions are disposed by being overlapped with the first movable unit 421 and the first fixed electrode 51 in a planar view, and remained two protrusion portions 6 are disposed by being overlapped with the second movable unit 422 and the second fixed electrode 52. Hereinafter, the protrusion portions 6 which are disposed by being overlapped with the first movable unit 421 and the first fixed electrode 51 in a planar view will be described in detail. In addition, since the protrusion portions 6 which are disposed by being overlapped with the second movable unit 422 and the second fixed electrode 52 in a planar view are the same as those which are disposed by being overlapped with the first movable unit 421 and the first fixed electrode 51 in a planar view, descriptions thereof will be omitted.

Figure 3:
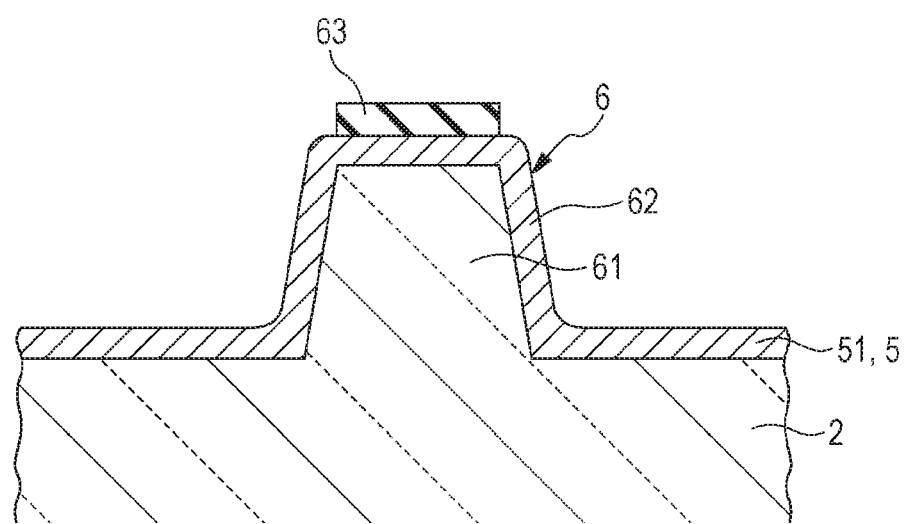
FIG. 3 is an enlarged sectional view which describes a protrusion portion provided in the physical quantity sensor which is illustrated in FIG. 1.

FIG. 3 is an enlarged sectional view which describes the protrusion portion which is provided in the physical quantity sensor illustrated in FIG. 1.

As illustrated in FIG. 3, each protrusion portion 6 includes a protrusion 61 which is formed on the base substrate 2, a conductive layer 62 which covers the protrusion 61, and an insulating layer 63 which is provided on a side opposite to the protrusion 61 of the conductive layer 62.

Here, the conductive layer 62 has the same potential as that of the first fixed electrode 51. Due to this, at a time of manufacturing the physical quantity sensor 1, which will be described in detail later, it is possible to prevent or alleviate bonding of the movable unit 42 and the base substrate 2, by electrically connecting the movable unit 42, and the first fixed electrode 51 and the second fixed electrode 52, when performing anodic bonding of the base substrate 2 and the lid (another substrate), for example.

The insulating layer 63 is provided on a side opposite to the base substrate 2 (more specifically, tip end side of protrusion portion 6) with respect to the conductive layer 62. Due to this, it is possible to prevent a short circuit between the movable unit 42 and the first and second fixed electrodes 51 and 52, even when the movable unit 42 is in contact with the protrusion portion 6.

The conductive layer 62 is configured integrally with the first fixed electrode 51. Due to this, it is possible to collectively form the conductive layer 62 of the protrusion portion 6 and the first fixed electrode 51. For this reason, it is possible to make a manufacturing process of the physical quantity sensor 1 which is associated with forming of the protrusion portion 6 simple.

In addition, the protrusion 61 is configured integrally with the base substrate 2 on the base substrate 2 side, with respect to the conductive layer 62. Due to this, it is possible to easily form the protrusion 61 which is relatively high when forming the base substrate 2 using etching, and as a result, it is possible to easily make the protrusion portion 6 high.

In addition, the insulating layer 63 may be insulative, and can be formed of various insulative materials such as a resin material, a metal oxide, silicon nitride, and a silicon oxide, and it is preferable to use a silicon oxide film. Due to this, it is possible to form the insulating layer 63 with an excellent insulating property simply, and with high accuracy using a film forming method.

According to the physical quantity sensor 1 which is configured as described above, it is possible to prevent or alleviate bonding to the base substrate 2 of the movable unit 42 using the protrusion portion 6, since the plurality of protrusion portions 6 are disposed at a position which is overlapped with the movable unit 42 in a planar view, on the movable unit 42 side of the base substrate 2. Here, it is possible to reduce damage of the protrusion portion 6 by increasing toughness of the protrusion portion 6, since the protrusion portion 6 is provided on the base substrate 2 side, not the movable unit 42 side. In addition, since the conductive layer 62 of the protrusion portion 6 has the same potential as those of the first fixed electrode 51 and the second fixed electrode 52, at a time of manufacturing the physical quantity sensor 1, it is possible to prevent or alleviate bonding of the movable unit 42 and the base substrate 2, by electrically connecting the movable unit 42, and the first fixed electrode 51 and the second fixed electrode 52, when performing anodic bonding of the base substrate 2 and the lid 3, for example.

In addition, since the insulating layer 63 of the protrusion portion 6 is provided at a tip end side of the protrusion portion 6 with respect to the conductive layer 62, it is possible to prevent a short circuit between the movable unit 42 and the first and second fixed electrodes 51 and 52, even when the movable unit 42 is in contact with the protrusion portion 6.

In addition, it is possible to prevent or alleviate damage, or the like, of the oscillating structure body 4 by regulating an excessive displacement of the movable unit 42 using the protrusion portion 6.

Manufacturing Method of Physical Quantity Sensor

Hereinafter, a manufacturing method of the physical quantity sensor of the invention will be described, by exemplifying a case of manufacturing the above described physical quantity sensor 1.

Figure 4:
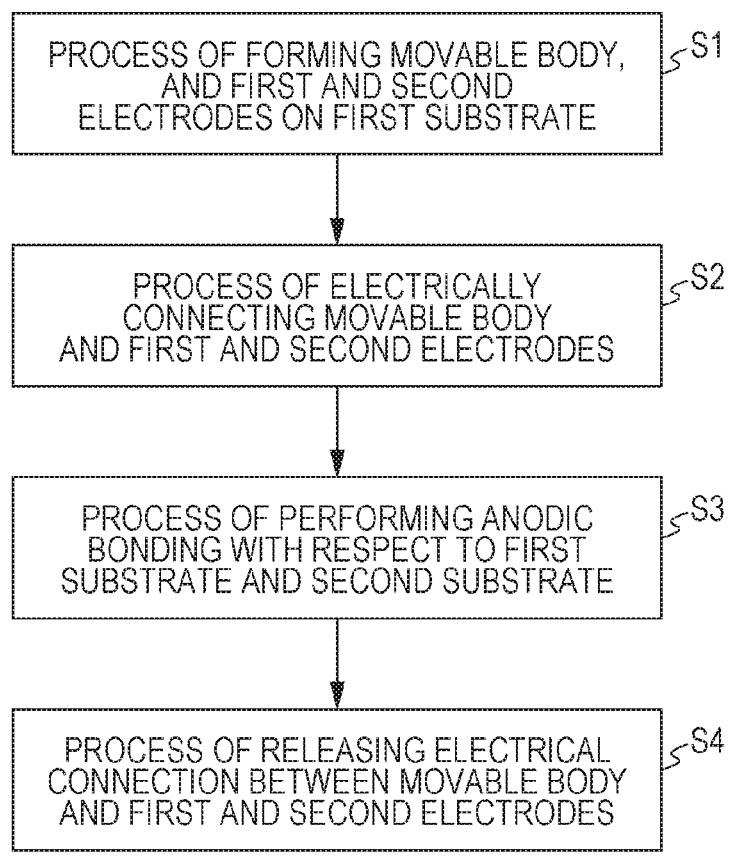
FIG. 4 is a flowchart which describes a manufacturing method of the physical quantity sensor illustrated in FIG. 1.
Figure 5:
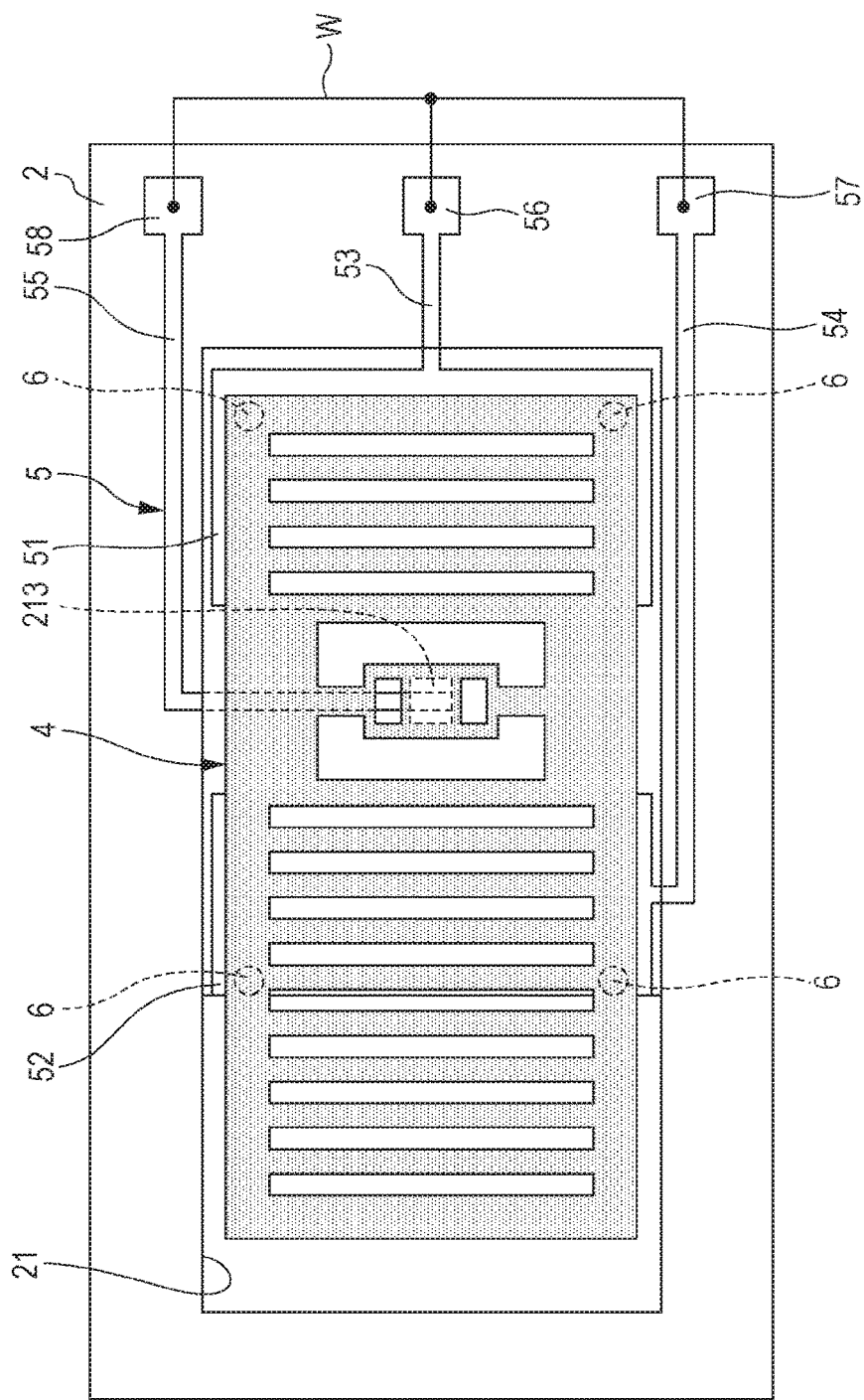
FIG. 5 is a plan view (top view) which describes a connecting process of a movable body and an electrode which are described in FIG. 4.
Figure 6:
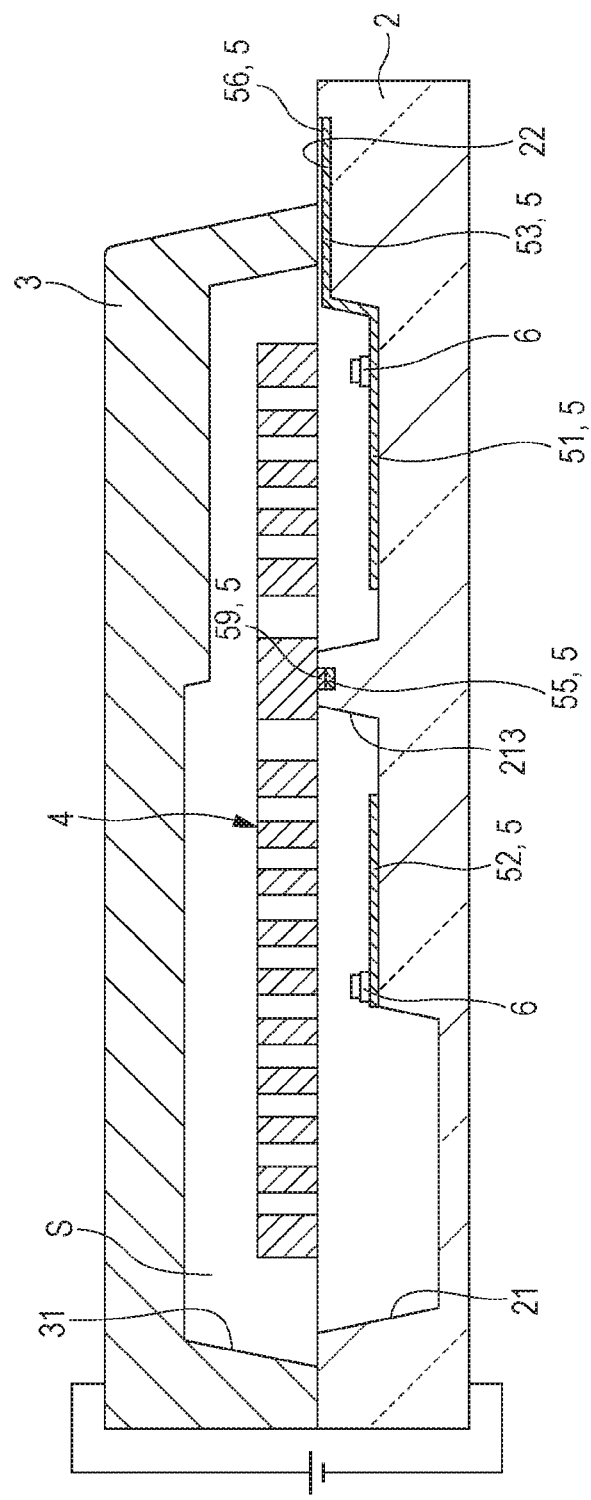
FIG. 6 is a sectional view which describes an anodic bonding process which is described in FIG. 4.

FIG. 4 is a flowchart which describes a manufacturing method of the physical quantity sensor illustrated in FIG. 1. FIG. 5 is a plan view (top view) which describes a process of connecting a movable body and electrodes which are described in FIG. 4. FIG. 6 is a sectional view which describes an anodic bonding process which is described in FIG. 4.

The manufacturing method of the physical quantity sensor 1 includes [1] a process of forming the oscillating structure body 4 and the conductive pattern 5 on the base substrate 2 (step S1), [2] a process of electrically connecting each of the portions of the conductive pattern 5 (step S2), [3] a process of bonding the base substrate 2 and the lid 3 (step S3), and [4] a process of releasing the electrical connection in the process [2] (step S4). Hereinafter, each process will be described in order.

[1] First, the oscillating structure body 4 and the conductive pattern 5 are formed on the base substrate 2. Due to this, the movable unit 42, and the first fixed electrode 51 and the second fixed electrode 52 are formed on the base substrate 2 (step S1).

When describing specifically, in the process, first, the base substrate 2 is formed by etching a glass substrate, for example. At this time, the protrusion 61 of the protrusion portion 6 is formed associated with forming of the base substrate 2. In addition, a metal film is formed on the base substrate 2, and the conductive pattern 5 is formed by etching the metal film. At this time, the conductive layer 62 of the protrusion portion 6 is formed associated with forming of the conductive pattern 5. Thereafter, the oscillating structure body 4 is formed by bonding a silicon substrate to a face of the base substrate on the conductive pattern 5 side using anodic bonding, etching the silicon substrate, etching the silicon substrate, and performing ion implantation of impurities, after forming the protrusion portion 6 by forming the insulating layer 63 using a CVD method, or the like.

As described above, in the process [1], the movable unit 42 which can be displaced with respect to the base substrate 2 by facing thereof, and the first fixed electrode 51 and the second fixed electrode 52 (electrodes) which face the movable unit 42 are formed on the base substrate 2 (first substrate), and the protrusion portion 6 which is overlapped with the movable unit 42, in a planar view, is formed on the movable unit 42 side of the base substrate 2.

[2] Subsequently, each of the portions of the conductive pattern 5 is electrically connected. In this manner, the movable unit 42, and the first fixed electrode and the second fixed electrode 52 are electrically connected (step S2).

When describing specifically, as illustrated in FIG. 5, for example, the terminals 56 and 57, and the terminal 58 are electrically connected using wiring W. The wiring W may have a portion which is separated from the base substrate 2, like a bonding wire, or may be formed integrally with the conductive pattern 5 on the base substrate 2.

As described above, in the process [2], the movable unit 42, and the first fixed electrode 51 and the second fixed electrode 52 are electrically connected. In addition, the process, and the above described process [1] can be simultaneously performed. For example, in a case of forming the wiring W integrally with the conductive pattern 5, the process, and the forming process of the conductive pattern 5 in the above described process [1] can be collectively (simultaneously) performed.

[3] Subsequently, the base substrate 2 and the lid are bonded while maintaining the electrically connected state in the above described process [2] (step S3). More specifically, for example, the base substrate 2 which is formed of glass, and the lid 3 which is formed of silicon are subjected to anodic bonding. At this time, as illustrated in FIG. 6, an electric field is applied between the base substrate 2 and the lid 3. As described above, since the movable unit 42, and the first fixed electrode 51 and the second fixed electrode 52 are electrically connected, the movable unit 42, and the first and second fixed electrodes 51 and 52 have the same potential. For this reason, the above described electric field is reduced between the movable unit 42 and the first and second fixed electrodes 51 and 52. As a result, it is possible to prevent or alleviate bonding to the base substrate 2 of the movable unit 42.

As described above, in the process [3], the lid 3 is bonded to the base substrate 2 in a state in which the movable unit 42, and the first fixed electrode 51 and the second fixed electrode 52 are electrically connected.

[4] Subsequently, the electrical connection in the process [2] is released. In this manner, the electrical connection between the movable unit 42 and the first and second fixed electrodes 51 and 52 is released (step S4).

In the process [4], for example, the above described wiring W is cut or removed, using a tool, a laser, or the like.

As described above, in the process [4], the electrical connection between the movable unit 42 and the first and second fixed electrodes 51 and 52 is released. Thereafter, the sealing portion 11 is formed. In addition, forming of the sealing portion 11 may be performed between the process [3] and the process [4].

It is possible to obtain the physical quantity sensor 1 through the above described processes [1] to [4].

According to the above described manufacturing method of the physical quantity sensor 1, it is possible to prevent or alleviate bonding to the base substrate 2 of the movable unit 42, even in a case in which the base substrate 2 and the lid 3 are subjected to anodic bonding.

Second Embodiment

Subsequently, a second embodiment of the invention will be described.

Figure 7:
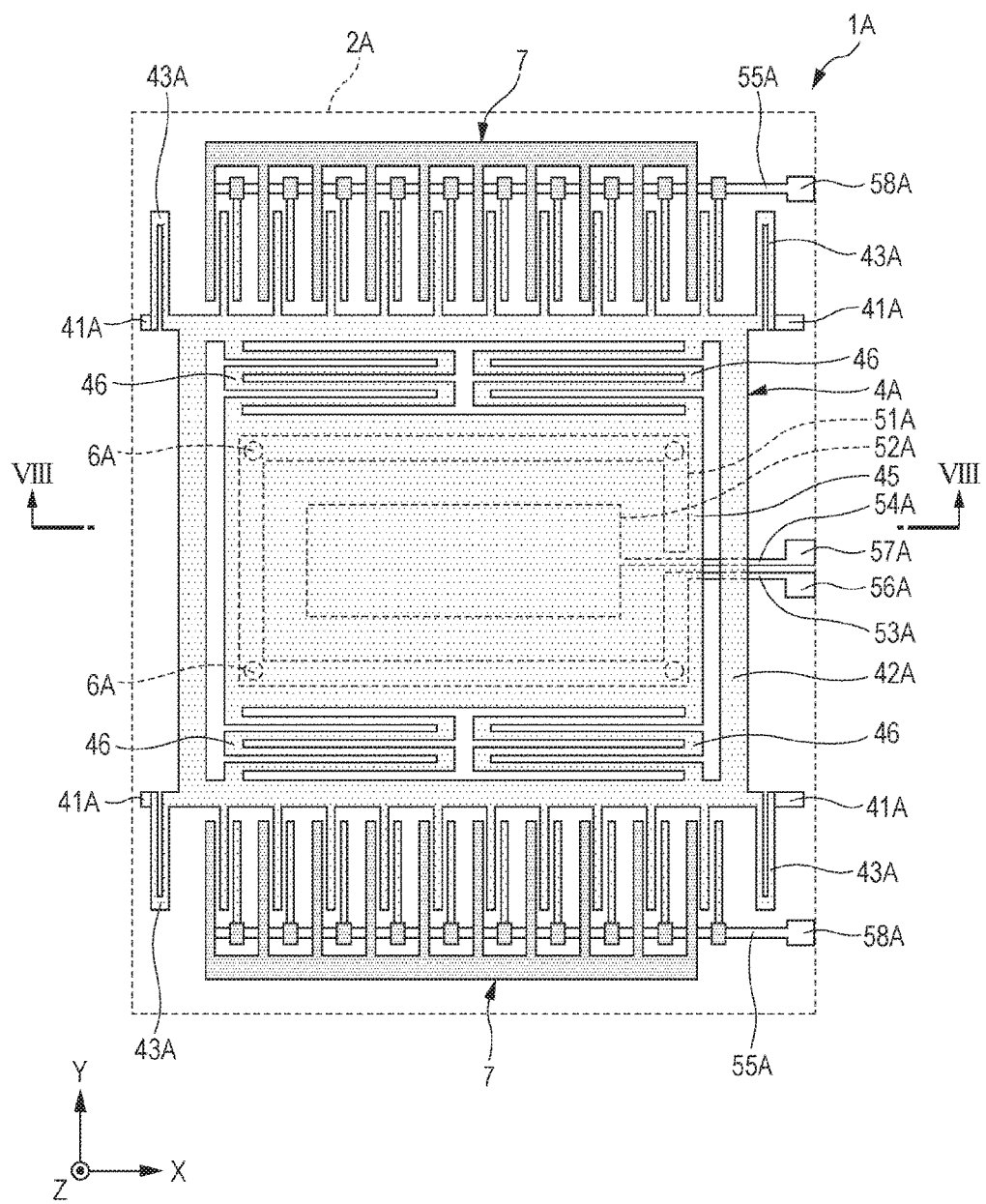
FIG. 7 is a plan view (top view) which illustrates a physical quantity sensor according to a second embodiment of the invention.
Figure 8:
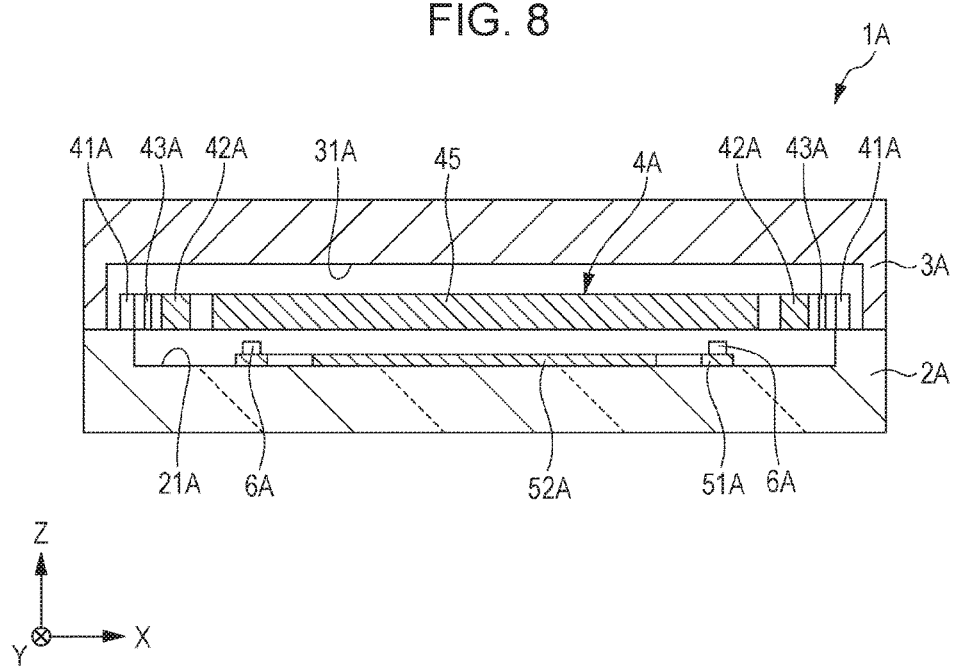
FIG. 8 is a sectional view which is taken along line VIII-VIII in FIG. 7.

FIG. 7 is a plan view (top view) which illustrates a physical quantity sensor according to the second embodiment. FIG. 8 is a sectional view which is taken along line VIII-VIII in FIG. 7.

The embodiment is the same as the above described first embodiment except for a gyro sensor to which the invention is applied.

In descriptions below, points different from the above described embodiment will be mainly described, and descriptions of the same points will be omitted, relating to the second embodiment.

A physical quantity sensor 1A illustrated in FIG. 7 is a gyro sensor which detects an angular velocity around the Y axis direction. As illustrated in FIGS. 7 and 8, the physical quantity sensor 1A includes a base substrate 2A (first substrate), a lid 3A (second substrate), an oscillating structure body 4A (movable electrode), a driving electrode 51A which causes the oscillating structure body 4A to perform oscillation driving, a pair of detecting electrodes 7 which detects detected oscillation of the oscillating structure body 4A, a monitor electrode 52A which detects a driving state of the oscillating structure body 4A, and a plurality of protrusion portions 6A which have a function of preventing bonding of the base substrate 2A and the oscillating structure body 4A.

The base substrate 2A and the lid 3A are bonded to each other, and a space for accommodating the oscillating structure body 4A and the pair of detecting electrodes 7 is formed between the base substrate 2A and the lid 3A.

The base substrate 2A and the lid 3A are formed in a plate shape, respectively, and are disposed along an XY plane (reference face) as a plane which includes the X axis and the Y axis. In addition, a recessed portion 21A which has a function of preventing a movable portion of the oscillating structure body 4A from being in contact with the base substrate 2A is provided on a top face of the base substrate 2A. A recessed portion 31A which is formed so as to cover the oscillating structure body 4A and the pair of detecting electrodes 7 in a non-contact manner is provided on a lower face of the lid 3A.

The oscillating structure body 4A includes a detecting unit 42A (movable body), four fixed portions 41A which are fixed to the base substrate 2A, four beam portions 43A (second beam portion) which connect the detecting unit 42A and the four fixed portions 41A, a driving unit 45 (movable body), and four beam portions 46 (first beam portion) which connect the detecting unit 42A and the driving unit 45, and these elements are integrally formed.

The detecting unit 42A includes a frame portion which is formed in a frame shape when viewed planarly, and a movable electronic unit for detecting which is formed of a plurality of electrode fingers which extend from the frame portion to the outside along the Y axis direction.

The four fixed portions 41A are bonded and fixed to a top face of the base substrate 2A on the outer side of the above described recessed portion 21A of the base substrate 2A. The four fixed portions 41A are disposed on the outer side of the detecting unit 42A by being separated from each other, respectively, when viewed planarly.

The four beam portions 43A are provided corresponding to the four fixed portions 41A, and connect a corresponding fixed portion 41A and the detecting unit 42A, respectively. Each beam portion 43A is formed in a meander shape which extends along the X axis direction, while reciprocating in the Y axis direction when viewed planarly. Due to this, it is possible to make each beam portion 43A long while attempting miniaturization. In addition, by making each beam portion 43A long, it is possible to easily perform a displacement of the detecting unit 42A in the X axis direction which is accompanied by a bending deformation of each beam portion 43A. Each beam portion 43A may not be formed in the meander shape, as described above, and for example, may be a shape which extends along the Y axis direction when viewed planarly.

The driving unit 45 is disposed inside the above described detecting unit 42A when viewed planarly. The driving unit 45 is formed in a plate shape which goes along a reference face, by setting a top face of the above described base substrate 2A to the reference face.

The four beam portions 46 connect the detecting unit 42A and the driving unit 45, respectively. Each beam portion 46 is formed in the meander shape which extends in the Y axis direction while reciprocating in the X axis direction. Due to this, it is possible to make each beam portion 46 long, while attempting miniaturization. In addition, it is possible to easily perform a displacement of the driving unit 45 in the Z axis direction which is accompanied by a bending deformation of each beam portion 46, by making a length of each beam portion 46 long.

The driving electrode 51A is fixed to a bottom face of the recessed portion 21A which is formed on the above described base substrate 2A. The driving electrode 51A is disposed so as to face the driving unit 45 with an interval. Here, the driving electrode 51A is disposed at a position which is overlapped with the driving unit 45 when viewed planarly. The driving electrode 51A is electrically connected to a terminal 56A which is provided on the outer side of the recessed portion 21A on a top face of the base substrate 2A through wiring 53A.

A pair of detecting electrodes 7 is bonded and fixed to the top face of the base substrate 2A on the outer side of the recessed portion 21A of the above described base substrate 2A. The pair of detecting electrodes 7 is disposed by being aligned in the Y axis direction so as to interpose the oscillating structure body 4A. The pair of detecting electrodes 7 can be collectively formed along with the oscillating structure body 4A, by processing (for example, etching processing) one substrate (for example, silicon substrate).

Each detecting electrode 7 is configured of a plurality of electrode fingers which are disposed by being alternately aligned along the X axis direction, and a connecting portion which alternately connects end portions of the plurality of electrode fingers on a side opposite to the oscillating structure body 4A. Each electrode finger extends along the Y axis direction. In addition, each of electrode fingers which is connected in the connecting portion faces one side face of the electrode finger of the above described detecting unit 42A, and meanwhile, each of electrode fingers which is not connected in the connecting portion faces the other side face of the electrode finger of the detecting unit 42A.

The detecting electrode 7 is electrically connected to a terminal 58A which is provided on the outer side of the recessed portion 21A on the top face of the base substrate 2A through wiring 55A.

The monitor electrode 52A is bonded and fixed to a bottom face of the recessed portion 21A which is formed on the above described base substrate 2A. The monitor electrode 52A is disposed at a position which is overlapped with the driving unit 45 when viewed planarly. The monitor electrode 52A is electrically connected to a terminal 57A which is provided on the outer side of the recessed portion 21A on the top face of the base substrate 2A through wiring 54A.

The physical quantity sensor 1A which is configured in the above described manner is operated as follow.

A voltage which is periodically changed (for example, alternating voltage) is applied, as a driving voltage, between the driving electrode 51A and the driving unit 45 which face each other. Then, electrostatic attraction of which intensity is periodically changed occurs between the driving electrode 51A and the driving unit 45, and due to this, the driving unit 45 oscillates in the Z axis direction, accompanied by an elastic deformation of the beam portion 46. At this time, a capacitance between the monitor electrode 52A and the driving unit 45 is detected, and a driving voltage is controlled based on a detection result thereof, as necessary. In this manner, it is possible to perform a control so that an oscillation of the driving unit 45 becomes a desired oscillation.

When an angular velocity around the Y axis direction is added to the physical quantity sensor 1A in a state in which the driving unit 45 is oscillated in this manner, the Coriolis force in the X axis direction is generated in the driving unit 45, and the detecting unit 42A oscillates in the X axis direction due to an operation of the Coriolis force. Due to this, a capacitance between the detecting electrode 7 and the detecting unit 42A is changed. Accordingly, it is possible to detect an angular velocity which is added to the physical quantity sensor 1A based on the capacitance.

A plurality of (four in the embodiment) protrusion portions 6A are disposed at a position which is overlapped with the driving unit 45, in a planar view, on the driving unit 45 side of the base substrate 2A, as illustrated in FIG. 7. Due to this, it is possible to prevent or alleviate bonding to the base substrate 2A of the driving unit 45 using the protrusion portion 6A. Here, it is possible to reduce damage of the protrusion portion 6A by increasing toughness of the protrusion portion 6A, since the protrusion portion 6A is provided on the base substrate 2A side, not the driving unit 45 side. In addition, it is possible to prevent or reduce damage, or the like, of the oscillating structure body 4A as a structure including the driving unit 45, by regulating an excessive displacement of the driving unit 45 using the protrusion portion 6A.

The plurality of protrusion portions 6A are disposed by being overlapped with the outer peripheral portion of the driving unit 45 when viewed planarly.

2. Sensor Device

Subsequently, the sensor device of the invention will be described.

Figure 9:
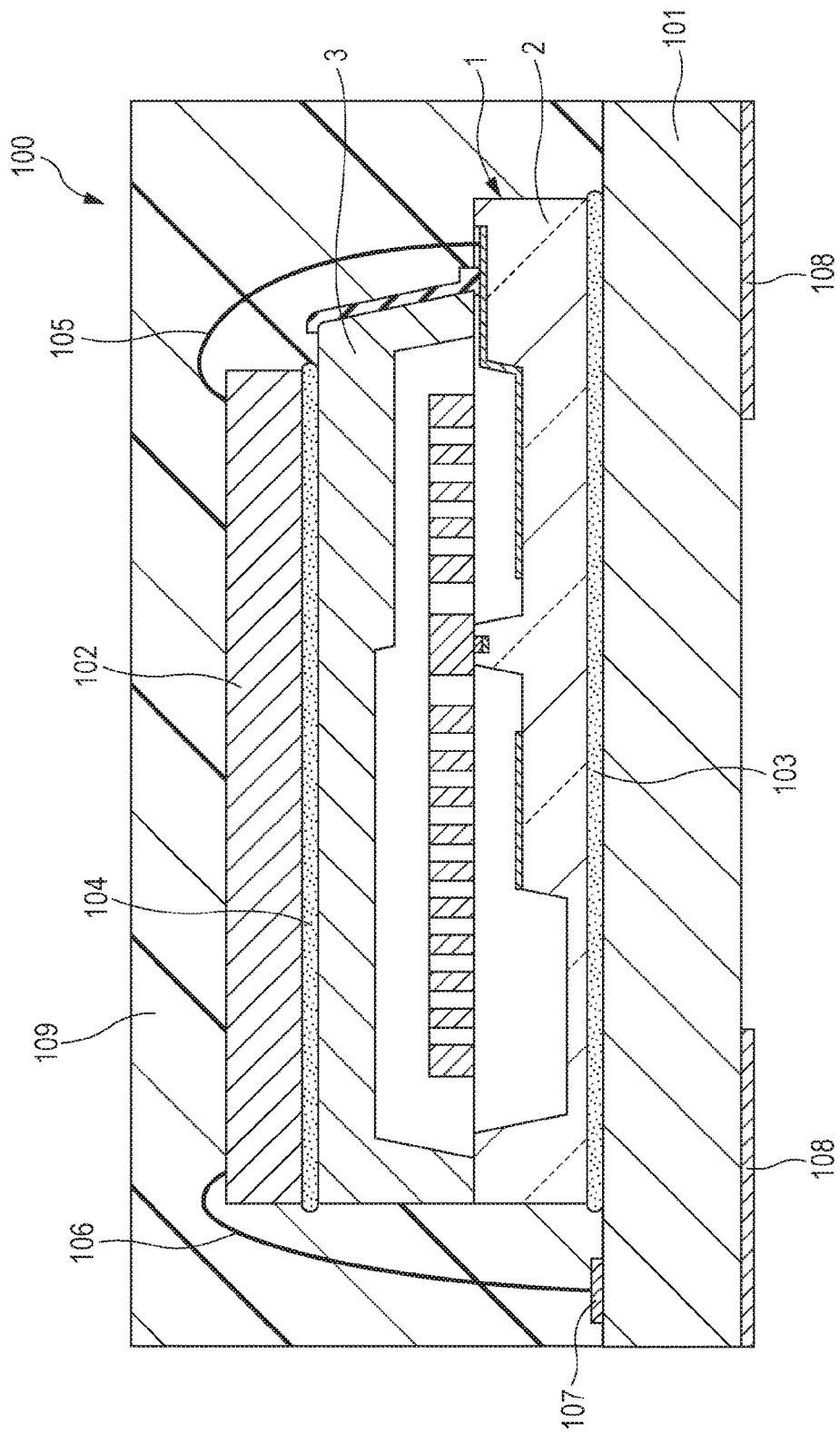
FIG. 9 is a sectional view which illustrates an example of a sensor device of the invention.

FIG. 9 is a sectional view which illustrates an example of the sensor device of the invention.

A sensor device 100 illustrated in FIG. 9 includes a substrate 101, a physical quantity sensor 1 which is fixed to a top face of the substrate 101 through an adhesive layer 103, and an IC chip (electronic component) 102 which is fixed to a top face of the physical quantity sensor 1 through an adhesive layer 104. In addition, the sensor device is molded, using a molding material 109 in a state in which the physical quantity sensor 1 and the IC chip 102 cause a lower face of the substrate 101 to be exposed. In addition, for the adhesive layers 103 and 104, it is possible to use, for example, soldering, silver paste, a resin-based adhesive (die attach adhesive), or the like. In addition, as the molding material 109, it is possible to use a thermosetting epoxy resin, for example, and it is possible to perform molding, using a transfer molding method, for example.

A plurality of terminals 107 are disposed on the top face of the substrate 101, and a plurality of mounting terminals 108 which are connected to the terminal 107 through internal wiring (not illustrated) or castellation are disposed on a lower face thereof. The substrate 101 is not limited, particularly, and for example, it is possible to use a silicon substrate, a ceramic substrate, a resin substrate, a glass substrate, a glass epoxy substrate, or the like.

For example, a driving circuit which drives the physical quantity sensor 1, a correction circuit which corrects a differential signal of the capacitances Ca and Cb, a detecting circuit which detects acceleration from the differential signal of the capacitances Ca and Cb, an output circuit which converts a signal from the detecting circuit into a predetermined signal, and outputs thereof, and the like, are included in the IC chip 102. The IC chip 102 is electrically connected to the terminals 56, 57, and 58 of the physical quantity sensor 1 through the bonding wire 105, and is electrically connected to the terminal 107 of the substrate 101 through the boding wire 106.

Since the sensor device 100 is provided with the physical quantity sensor 1, the device has an excellent reliability.

3. Electronic Apparatus

Subsequently, the electronic apparatus of the invention will be described.

Figure 10:
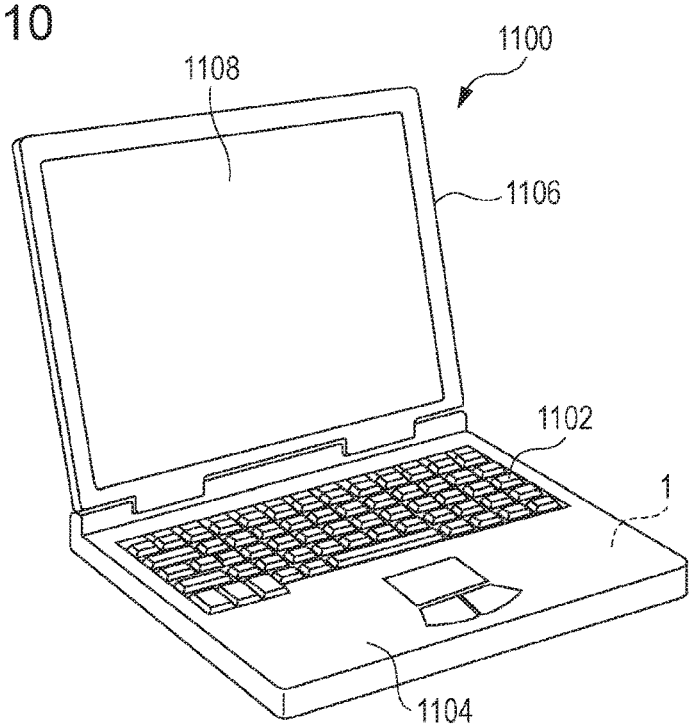
FIG. 10 is a perspective view which illustrates a configuration of a mobile (or notebook) personal computer to which an electronic apparatus of the invention is applied.

FIG. 10 is a perspective view which illustrates a configuration of a mobile (or notebook) personal computer to which the electronic apparatus of the invention is applied.

In the figure, a personal computer 1100 is configured of a main body unit 1104 which is provided with a keyboard 1102, and a display unit 1106 which is provided with a display section 1108, and the display unit 1106 is rotatably supported with respect to the main body unit 1104 through a hinge structure unit. The physical quantity sensor 1 which measures a physical quantity such as acceleration or an angular velocity for measuring falling or an inclination thereof is mounted on the personal computer 1100. It is possible to obtain the personal computer 1100 with high reliability by mounting the above described physical quantity sensor 1 in this manner.

Figure 11:
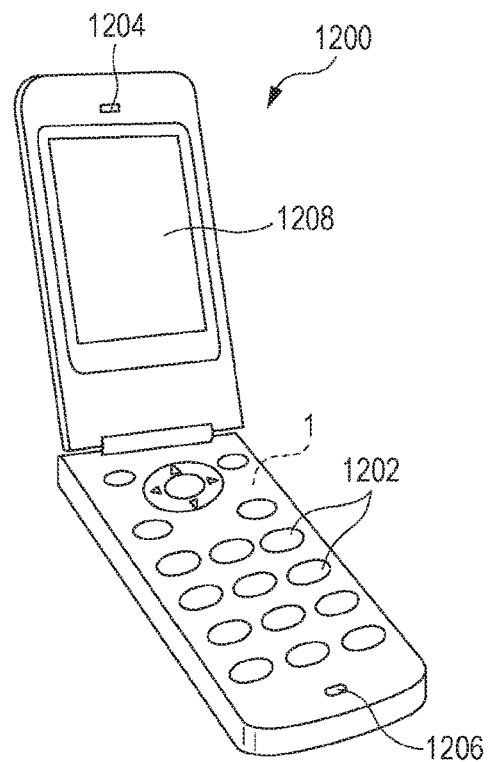
FIG. 11 is a perspective view which illustrates a configuration of a mobile phone (also including PHS) to which the electronic apparatus of the invention is applied.

FIG. 11 is a perspective view which illustrates a configuration of a mobile phone (also including PHS) to which the electronic apparatus of the invention is applied.

In the figure, a mobile phone 1200 is provided with an antenna (not illustrated), a plurality of operation buttons 1202, an ear piece 1204, and a mouth piece 1206, and a display unit 1208 is disposed between the operation buttons 1202 and the ear piece 1204. The physical quantity sensor 1 for measuring a physical quantity such as acceleration or an angular velocity for measuring falling or an inclination thereof is mounted on the mobile phone 1200. It is possible to obtain the mobile phone 1200 with high reliability, by mounting the above described physical quantity sensor 1 in this manner.

Figure 12:
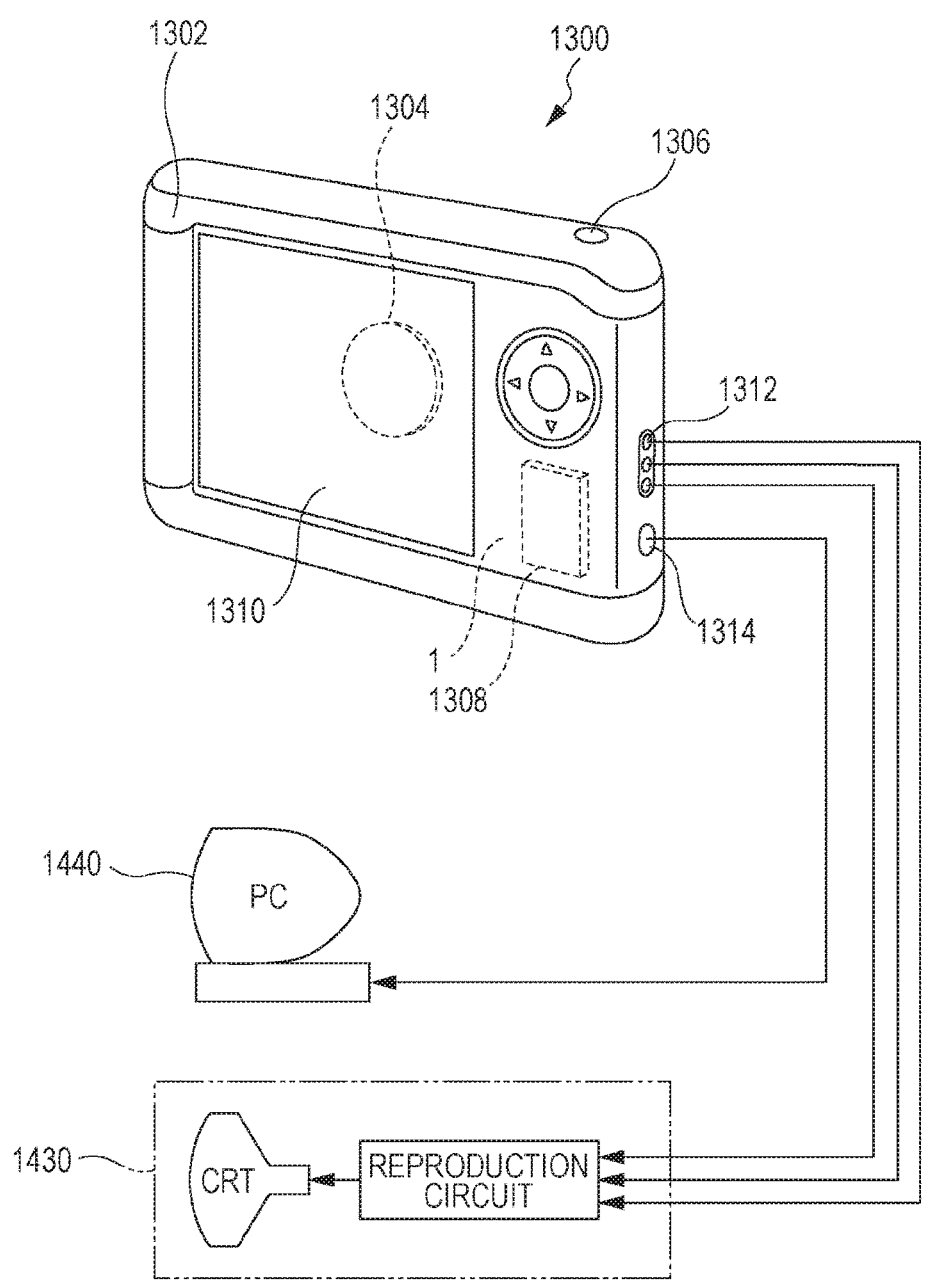
FIG. 12 is perspective view which illustrates a configuration of a digital still camera to which the electronic apparatus of the invention is applied.

FIG. 12 is a perspective view which illustrates a configuration of a digital still camera to which the electronic apparatus of the invention is applied. In addition, a connection with an external device is also simply illustrated in the figure.

Here, a normal camera causes a silver halide photographic film to be exposed to light using a light image of a subject, and in contrast to this, a digital still camera 1300 generates an imaging signal (image signal) by performing a photoelectric conversion with respect to the light image of the subject using an imaging element such as a charge coupled device (CCD).

In the digital still camera 1300, a display unit 1310 is provided on the rear face of a case (body) 1302, it is a configuration in which displaying is performed based on an imaging signal using the CCD, and the display unit 1310 functions as a finder which displays a subject as an electronic image. In addition, a light receiving unit 1304 which includes an optical lens (of optical imaging system), the CCD, or the like, is provided on the front face side (rear face side in figure) of the case 1302.

When a photographer checks a subject image which is displayed on the display unit, and presses a shutter button 1306, an imaging signal of the CCD at that time is transferred and stored in a memory 1308. In addition, in the digital still camera 1300, a video signal output terminal 1312, and an input-output terminal 1314 for data communication are provided on the side face of the case 1302. As illustrated, a television monitor 1430 is connected to the video signal output terminal 1312, and a personal computer 1440 is connected to the input-output terminal 1314 for data communication, respectively, as necessary. In addition, the digital still camera has a configuration in which an imaging signal stored in the memory 1308 is output to the television monitor 1430, or the personal computer 1440 using a predetermined operation. The physical quantity sensor 1 which measures a physical quantity such as acceleration or an angular velocity for measuring falling or an inclination thereof is mounted on the digital still camera 1300. It is possible to obtain the digital still camera 1300 with high reliability, by mounting the above described physical quantity sensor 1 in this manner.

The electronic apparatus of the invention can be applied to for example, a smart phone, a tablet terminal, a clock, an ink jet ejecting apparatus (for example, ink jet printer), a laptop personal computer, a television, a video camera, a video tape recorder, a car navigation device, a pager, an electronic organizer (also including electronic organizer with communication function), an electronic dictionary, an electronic calculator, an electronic game device, a word processor, a work station, a television phone, a crime preventing television monitor, electronic binoculars, a POS terminal, medical equipment (for example, electronic thermometer, sphygmomanometer, blood sugar meter, electrocardiogram measurement device, ultrasonic diagnostic device, electronic endoscope), a fish finder, various measurement devices, instruments (for example, instruments for vehicle, air plane, ship), a flight simulator, and the like, in addition to the personal computer (mobile personal computer) in FIG. 10, the mobile phone in FIG. 11, and the digital still camera in FIG. 12.

4. Moving Object

Subsequently, the moving object of the invention will be described.

Figure 13:
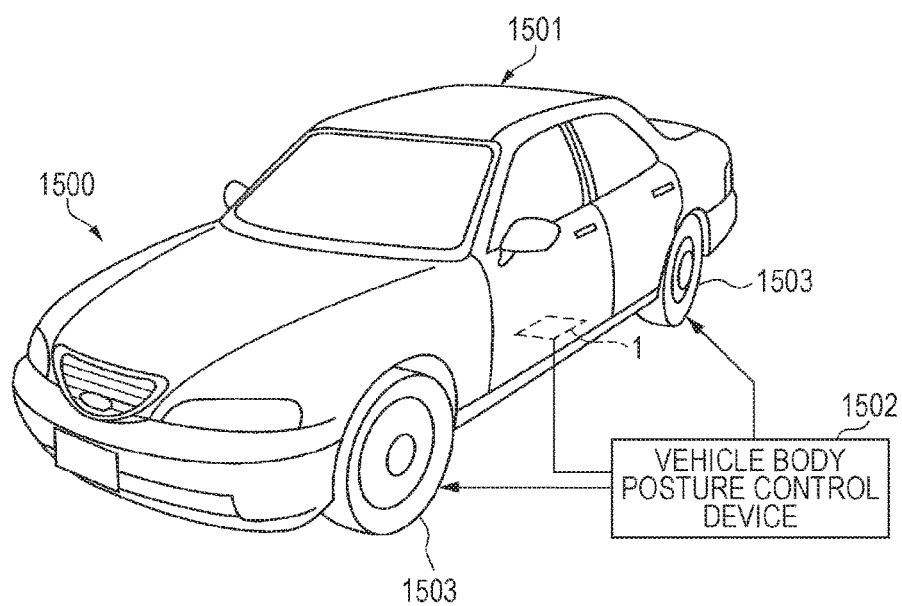
FIG. 13 is a perspective view which illustrates a vehicle to which a moving object of the invention is applied.

FIG. 13 is a perspective view which illustrates a vehicle to which the moving object of the invention is applied.

The physical quantity sensor 1 is built in a vehicle 1500, and for example, it is possible to detect a posture of a vehicle body 1501 using the physical quantity sensor 1. A detecting signal of the physical quantity sensor 1 is supplied to a vehicle body posture control device 1502, and the vehicle body posture control device 1502 detects a posture of the vehicle body 1501 based on the signal, and can control hardness and softness of suspension, or control a brake of an individual wheel 1503 according to a detected result.

Hitherto, the physical quantity sensor, the manufacturing method of the physical quantity sensor, the electronic apparatus, and the moving object of the invention have been described based on the embodiments which are illustrated; however, the invention is not limited to these, and a configuration of each unit can be replaced with an arbitrary configuration with the same function. In addition, another arbitrary component may be added to the invention.

In the above described embodiments, the case in which the invention is applied to the seesaw-type physical quantity sensor, and the gyro sensor of a parallel flat plate type has been exemplified; however, the physical quantity sensor of the invention may be a sensor in which a movable body is provided so as to be displaced with respect to a substrate, and for example, and the physical quantity sensor also can be applied to a flap-type physical quantity sensor, without being limited to a structure in the above described embodiments.

The entire disclosure of Japanese Patent Application No. 2015-191434, filed Sep. 29, 2015 is expressly incorporated by reference herein.

What is claimed is:

1. A physical quantity sensor comprising:
a substrate;
a fixed electrode which is disposed on the substrate, the fixed electrode being generally in a rectangular shape with four corners;
a movable body which is provided above the fixed electrode via a gap, the movable body being movable with respect to the fixed electrode, the movable body being generally in a rectangular shape with four corners; and
a protrusion which is disposed at a position overlapped with the movable body in a plan view on the substrate,
wherein the protrusion is configured by stacked layers including a conductive layer and an insulating layer, and the conductive layer is directly provided on the fixed electrode so that the conductive layer has a same potential as the fixed electrode, and
the physical quantity sensor detects a capacitance change between the fixed electrode and the movable body.

2. The physical quantity sensor according to claim 1, wherein the protrusion is overlapped with the fixed electrode in the plan view, and
the conductive layer is configured integrally with the fixed electrode.

3. The physical quantity sensor according to claim 2, wherein a projection part of the protrusion is configured integrally with the substrate, and
the conductive layer is provided on the projection part of the protrusion.

4. The physical quantity sensor according to claim 2, wherein the insulating layer is a silicon oxide film.

5. The physical quantity sensor according to claim 2, wherein the movable body is provided so as to oscillate around an oscillation center axis, the movable body is sectioned into a first movable member and a second movable member, and the oscillation center axis is a boundary between the first and second movable members, and
wherein the fixed electrode in configured with a first fixed electrode and a second fixed electrode, the first fixed electrode is disposed on the substrate so as to face the first movable member, and the second fixed electrode is disposed on the substrate so as to face the second movable member.

6. The physical quantity sensor according to claim 5, wherein an area of the second movable member is larger than an area of the first movable member in the plan view.

7. The physical quantity sensor according to claim 1, wherein a projection part of the protrusion is configured integrally with the substrate, and
the conductive layer is provided on the projection part of the protrusion.

8. The physical quantity sensor according to claim 7, wherein the insulating layer is a silicon oxide film.

9. The physical quantity sensor according to claim 7, wherein the movable body is provided so as to oscillate around an oscillation center axis, the movable body is sectioned into a first movable member and a second movable member, and the oscillation center axis is a boundary between the first and second movable members, and
wherein the fixed electrode is configured with a first fixed electrode and a second fixed electrode, the first fixed electrode is disposed on the substrate so as to face the first movable member, and the second fixed electrode is disposed on the substrate so as to face the second movable member.

10. The physical quantity sensor according to claim 9, wherein an area of the second movable member is larger than an area of the first movable member in the plan view.

11. The physical quantity sensor according to claim 1, wherein the insulating layer is a silicon oxide film.

12. The physical quantity sensor according to claim 11, wherein the movable body is provided so as to oscillate around an oscillation center axis, the movable body is sectioned into a first movable member and a second movable member, and the oscillation center axis is a boundary between the first and second movable members, and
wherein the fixed electrode is configured with a first fixed electrode and a second fixed electrode, the first fixed electrode is disposed on the substrate so as to face the first movable member, and the second fixed electrode is disposed on the substrate so as to face the second movable member.

13. The physical quantity sensor according to claim 12, wherein an area of the second movable member is larger than an area of the first movable member in the plan view.

14. The physical quantity sensor according to claim 1, wherein the movable body is provided so as to oscillate around an oscillation center axis, the movable body is sectioned into a first movable member and a second movable member, and the oscillation center axis is a boundary between the first and second movable members, and wherein the fixed electrode is configured with a first fixed electrode and a second fixed electrode, the first fixed electrode is disposed on the substrate so as to face the first movable member, and the second fixed electrode is disposed on the substrate so as to face the second movable member.

15. The physical quantity sensor according to claim 14, wherein an area of the second movable member is larger than an area of the first movable member in the plan view.

16. A sensor device comprising:
the physical quantity sensor according to claim 1; and
an electronic component which is electrically connected to the physical quantity sensor.

17. An electronic apparatus comprising:
the physical quantity sensor according to claim 1;
a display; and
a housing that houses the physical quantity sensor and the display.

18. A moving object comprising:
the physical quantity sensor according to claim 1; and
a movable body that houses the physical quantity sensor.

* * * * *